(12) United States Patent
Johnsen (10) Patent No.: US 10,193,314 B2
(45) Date of Patent: *Jan. 29, 2019

(54) POWER DISTRIBUTION PANEL WITH MODULAR CIRCUIT PROTECTION ELEMENTS

(71) Applicant: CommScope Technologies LLC, Hickory, NC (US)

(72) Inventor: David J. Johnsen, Plymouth, MN (US)

(73) Assignee: CommScope Technologies LLC, Hickory, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 14/500,567

(22) Filed: Sep. 29, 2014

(65) Prior Publication Data

US 2015/0016029 A1   Jan. 15, 2015

Related U.S. Application Data

(62) Division of application No. 13/246,620, filed on Sep. 27, 2011, now Pat. No. 8,848,346.

(60) Provisional application No. 61/387,272, filed on Sep. 28, 2010.

(51) Int. Cl.
| | |
|---|---|
| H02B 1/32 | (2006.01) |
| H02B 1/056 | (2006.01) |
| H02B 1/26 | (2006.01) |
| H05K 7/18 | (2006.01) |
| H01R 9/24 | (2006.01) |

(52) U.S. Cl.
CPC ............... *H02B 1/32* (2013.01); *H02B 1/056* (2013.01); *H02B 1/26* (2013.01); *H05K 7/186* (2013.01); *H01R 9/2425* (2013.01)

(58) Field of Classification Search
CPC . H02B 1/32; H02B 1/056; H02B 1/26; H05K 7/186
USPC ......................................... 361/646, 652, 644
See application file for complete search history.

(56) References Cited

U.S. PATENT DOCUMENTS

| | | | |
|---|---|---|---|
| 4,083,777 A * | 4/1978 | Hutchisson | A61M 1/16 210/186 |
| 6,315,580 B1 | 11/2001 | Hurtubisc et al. | |
| 6,354,890 B2 | 3/2002 | Adkins et al. | |
| 6,358,099 B1 | 3/2002 | Kolody et al. | |
| 6,359,770 B1 * | 3/2002 | Kolody | H01R 12/7088 361/626 |
| 6,414,245 B1 * | 7/2002 | Lopp | H01H 1/5805 174/255 |

(Continued)

*Primary Examiner* — Timothy Thompson
*Assistant Examiner* — Charles Pizzuto
(74) *Attorney, Agent, or Firm* — Merchant & Gould P.C.

(57) ABSTRACT

A power panel and modules for use in a power panel are disclosed. One disclosed chassis includes a top, a bottom, a front, a rear, and left and right sides, and an input power bus having a plurality of connection apertures therethrough. A plurality of circuit modules are mounted within the chassis. Each circuit module includes a circuit protection element including first and second bullet-nosed connectors, and a body element having first and second holes positioned to receive the first and second bullet-nosed connectors. The body element includes a bullet-nosed input connector sized to be received by one of the plurality of connection apertures. Each circuit element also includes an output terminal extending rearwardly from the body element.

12 Claims, 9 Drawing Sheets

(56) References Cited

U.S. PATENT DOCUMENTS

| | | | |
|---|---|---|---|
| 6,522,542 B1* | 2/2003 | Gordon | H05K 7/209 257/724 |
| 6,530,811 B1 | 3/2003 | Padulo et al. | |
| 6,560,123 B1* | 5/2003 | de Varennes | H01H 73/08 174/208 |
| 6,775,120 B2 | 8/2004 | Hernandez et al. | |
| 6,870,729 B2* | 3/2005 | Johnsen | H02B 1/06 200/50.03 |
| 7,120,002 B2 | 10/2006 | Hernandez et al. | |
| 7,480,127 B2 | 1/2009 | Hernandez et al. | |
| 7,554,796 B2* | 6/2009 | Coffey | H02J 1/108 307/42 |
| 7,768,760 B2 | 8/2010 | Hernandez et al. | |
| 7,994,653 B2* | 8/2011 | Gibson | H04Q 1/03 307/29 |
| 8,848,346 B2* | 9/2014 | Johnsen | H02B 1/26 361/644 |
| 2004/0169983 A1* | 9/2004 | Johnsen | H02B 1/06 361/115 |
| 2005/0033479 A1* | 2/2005 | Parker | F16K 37/0075 700/282 |
| 2010/0120286 A1* | 5/2010 | Johnsen | H01R 13/514 439/540.1 |
| 2010/0156578 A1* | 6/2010 | Schmidt | F02N 11/10 335/156 |

* cited by examiner

POWER DISTRIBUTION PANEL WITH MODULAR CIRCUIT PROTECTION ELEMENTS

CROSS-REFERENCE TO RELATED APPLICATIONS

This application is a divisional of application Ser. No. 13/246,620, filed Sep. 27, 2011, now U.S. Pat. No. 8,848, 346, which application claims the benefit of provisional application Ser. No. 61/387,272, filed Sep. 28, 2010, which applications are incorporated herein by reference in their entirety.

TECHNICAL FIELD

The present disclosure relates generally to a power distribution panel. In particular, the present disclosure relates to a power distribution with modular circuit elements.

BACKGROUND

Existing power distribution panels typically include a set of input terminals interconnected to a set of output power distribution terminals to distribute power from a power source to one or more pieces of equipment (e.g., telecommunications equipment) at an installation. These power distribution panels include the connection terminals on one side of the panel, with circuit protection elements (e.g., fuses or circuit breakers) mounted on an opposite side of the panel. In such arrangements, the connection blocks are connected to the circuit protection elements by wiring passing through the panel. In some cases, alarm circuits are included, and are used to generate a notification signal in case one of the circuit protection elements is tripped/blown. In some cases, connection terminals and circuit protection elements can be included on the same side of the panel as well.

This panel design has a variety of disadvantages. For example, such panels typically include a complex wiring arrangement passing through the body of the panel that is used to interconnect the circuit protection elements and terminals, as well as the alarm or control circuitry included in the panel. Furthermore, the mounting arrangement for each circuit protection element typically involves a screw-type mount for installing the circuit protection element, which can be time consuming in either installation or replacement circumstances. Additionally, because of the specific mounting sizes and layouts of typical power panels, exchanging of components, including circuit protection devices or circuitry, can be difficult.

For these and other reasons, improvements to existing electrical circuit panels are desirable.

SUMMARY

In accordance with the following disclosure, the above and other issues are addressed by the following:

In a first aspect, a power panel includes a chassis including a top, a bottom, a front, a rear, and left and right sides, and including a input power bus having a plurality of connection apertures therethrough. The power panel also includes a plurality of circuit modules mounted within the chassis. Each circuit module includes a circuit protection element including first and second bullet-nosed connectors, and a body element having first and second holes positioned to receive the first and second bullet-nosed connectors. The body element also includes a bullet-nosed input connector sized to be received by one of the plurality of connection apertures. Each circuit module also includes an output terminal extending rearwardly from the body element. The bullet-nosed input connector is electrically connected to the first bullet-nosed connector of the circuit protection element and the output terminal is electrically connected to the second bullet-nosed connector.

In a second aspect, a circuit module useable in a power distribution system is disclosed. The module includes a circuit protection element including first and second bullet-nosed connectors, and a body element having first and second holes positioned on a front surface to receive the first and second bullet-nosed connectors. The body element includes a bullet-nosed input connector and an output terminal extending from a rear surface.

In a third aspect, a method of configuring a power panel includes inserting a circuit module into a slot within a chassis, the chassis having a top, a bottom, a front, a rear, and left and right sides and including a input power bus having a plurality of connection apertures therethrough. The method also includes connecting an input power source to the input power bus, and connecting an output power connection to an output terminal extending rearwardly from a body element of the circuit module. In the method, the body element has first and second holes positioned to receive first and second bullet-nosed connectors of a circuit protection module, and includes a bullet-nosed input connector sized to be received by one of the plurality of connection apertures.

In a fourth aspect, a body element of a circuit module is disclosed. The body element includes a main body sized to be received into a slot of a power panel, and a bullet-nosed input power connection extending rearwardly from the main body. The body element further includes an output power bus extending rearwardly from the main body. The body element further includes a pair of bullet-nosed connector receptacles in a front side of the main body and spaced apart to receive bullet-nosed connectors of a circuit protection module.

In a fifth aspect, a method of assembling a power panel includes forming a chassis including a top, a bottom, a front, a rear, and left and right sides, the chassis including a input power bus having a plurality of connection apertures therethrough, and a plurality of slots therethrough. The method also includes inserting a circuit module into a slot within the chassis, the circuit module including a circuit protection element including first and second bullet-nosed connectors and a body element having first and second holes positioned on a front surface to receive the first and second bullet-nosed connectors, the body element including a bullet-nosed input connector and an output terminal extending from a rear surface. Inserting the circuit module into the slot connects the bullet-nosed input connector to the input power bus.

In a sixth aspect, a chassis for a power panel includes a top, a bottom, an open front, an open rear, and left and right sides forming a plurality of slots formed between the open front and open rear. The chassis further includes an input power bus at the open rear and a plurality of angled venting surfaces along the bottom, each of the angled venting surfaces including a plurality of venting openings.

DETAILED DESCRIPTION

In general, a power distribution panel is disclosed. The power distribution panel, as explained in further detail below, includes a plurality of circuit modules used to distribute high-current electricity from an input power bus, and to provide power signal protection in case of a current surge or other event that is potentially hazardous to connected electrical equipment. The modules used in the power distribution panel have reduced wiring requirements because each module can contain a circuit protection device and related control and alarming electronics. In certain embodiments, the modules are interchangeable and upgradeable to allow for customizable or changeable functionality within the panel.

Referring now to FIGS. 1-5, a power distribution panel 10 is shown. The power distribution panel 10 includes a chassis 12 having an interior 13 formed from a top 14, bottom 16, front 18, rear 20, and left and right sides 22, 24, respectively. The chassis 12 is, in the embodiment shown, sized to fit into a compact area, such as a telecommunications distribution office. In certain embodiments, the chassis 12 is approximately 17 inches wide; however, dimensions may vary according to the particular requirement of the panel.

In the embodiment shown, the chassis 12 includes a plurality of slots 26 extending through the panel 10, and sized to receive circuit modules 28. Each of the plurality of slots 26 extends through the chassis 12 to the open rear 20, so that circuit modules 28 can include portions exposed at both the front 18 and rear 20 of the chassis 12. Details regarding an example circuit module 28 are described below in conjunction with FIGS. 6-9.

Figure 1:
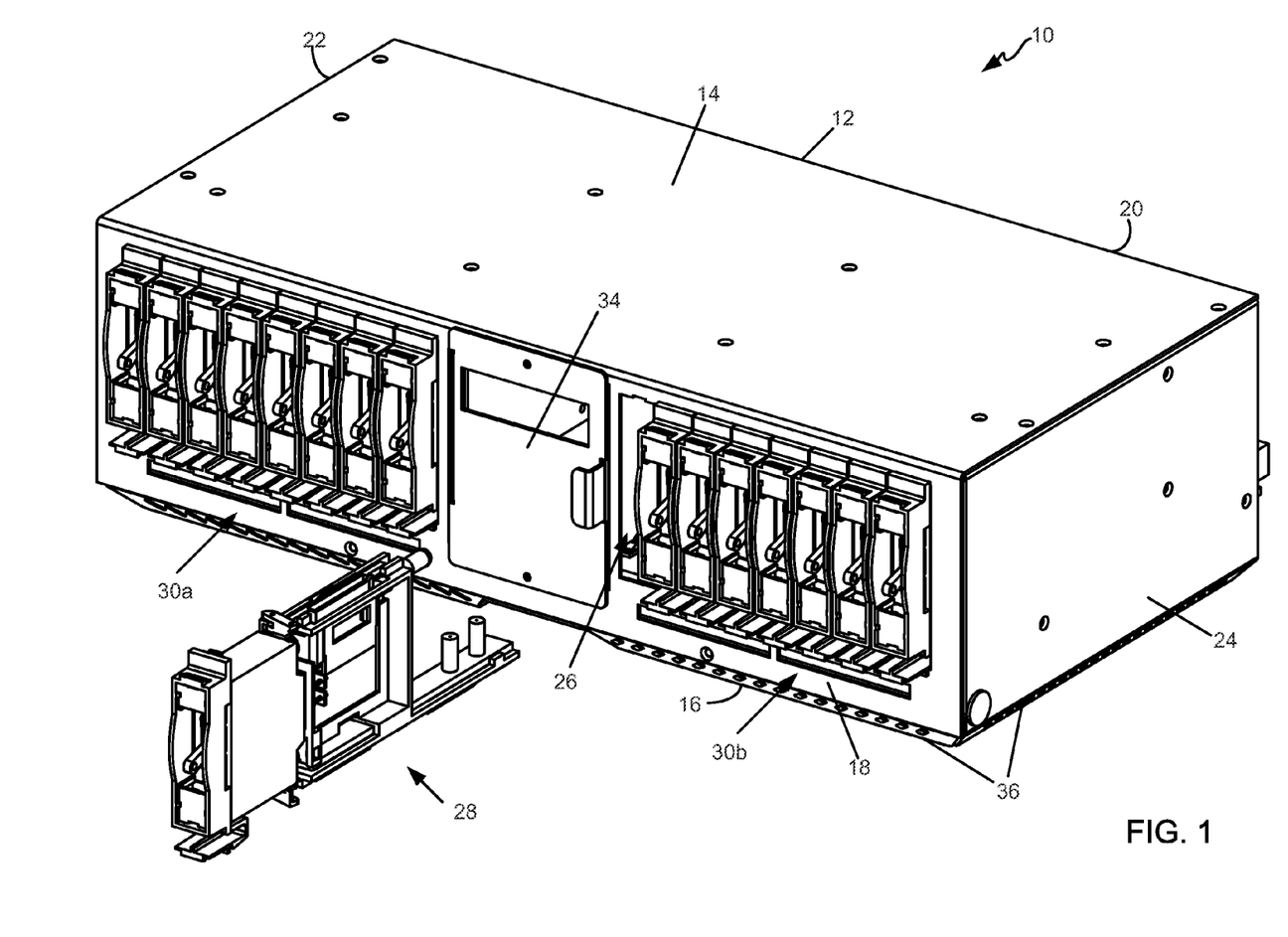
FIG. 1 is a front perspective view of a power distribution panel with modular circuit protection elements, according to a possible embodiment.

In the embodiment shown, the plurality of slots 26 are separated into a pair of slot banks 30a, 30b, which are disposed symmetrically on opposite sides of an opening 32 sized and arranged to receive a control unit 34. Although, in the embodiment shown, eight slots 26 are shown in each slot bank 30a-b (for a total of sixteen slots), the number of slots included in a chassis can vary according to the size of the modules used and the size or width of the chassis 12.

Figure 3:
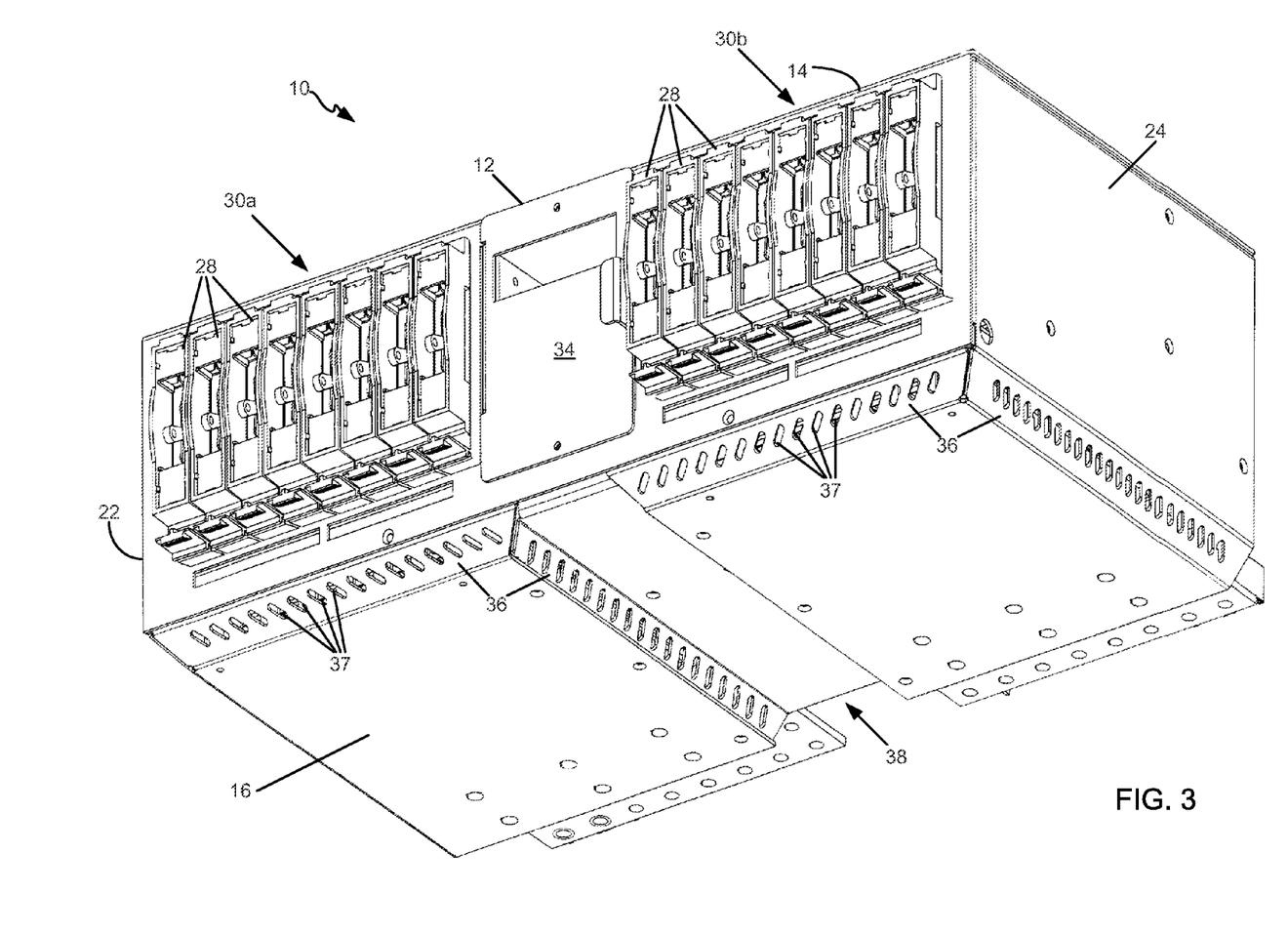
FIG. 3 is a bottom perspective view of the power distribution panel of FIG. 1.
Figure 4:
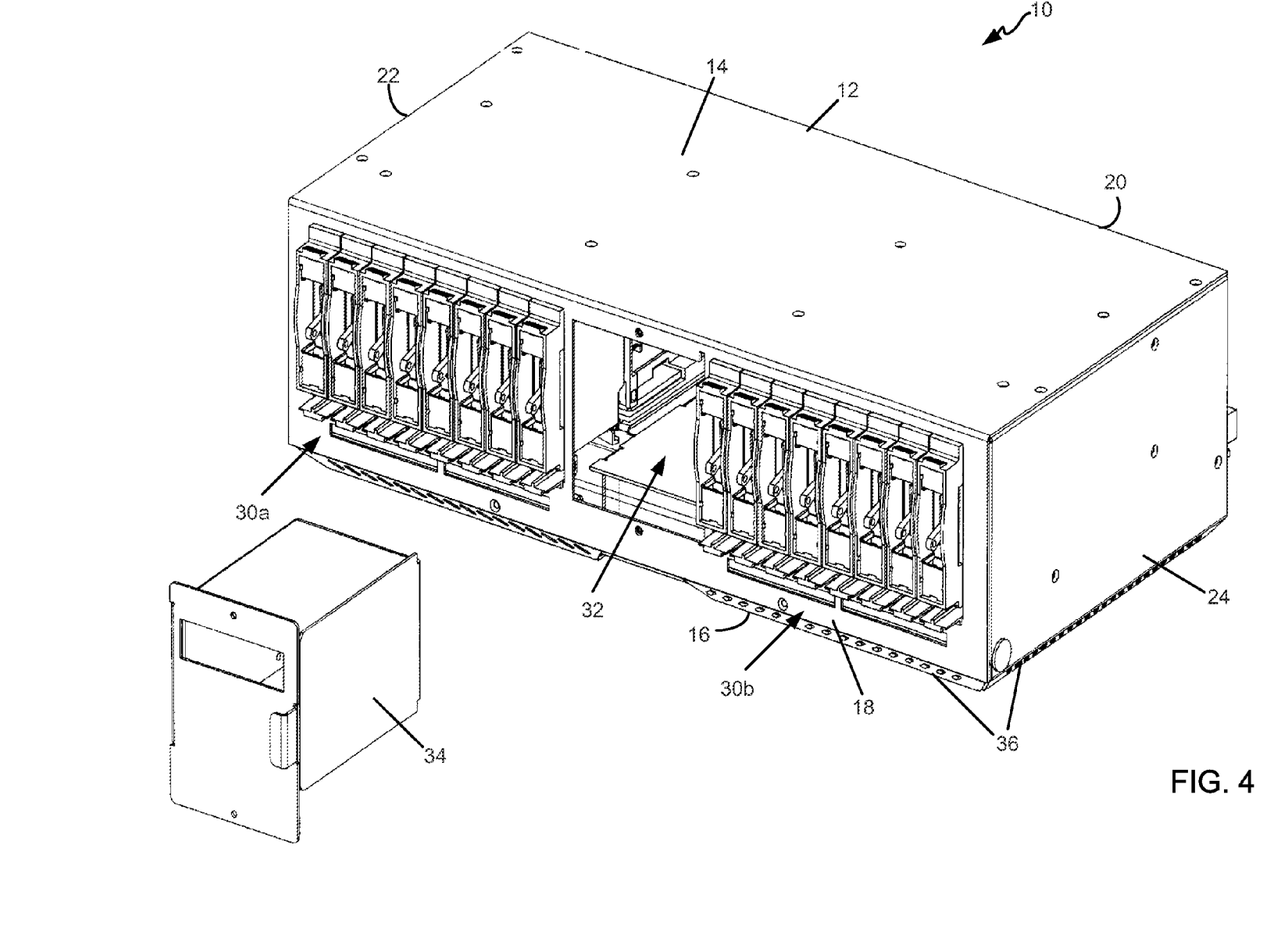
FIG. 4 is a front perspective view of a power distribution panel of FIG. 1, with a center control module removed.

In the embodiment shown, and as best seen in FIG. 3, the panel 10 also includes a plurality of angled surfaces 36 located along the bottom 16 of the chassis 12. The angled surfaces 36 each include openings, shown as angled venting slots 37, which allow airflow through the chassis 12 for cooling electronic equipment carried within the panel. In the embodiment shown, angled surfaces 36 are located below each of the slot banks 30a, 30b, including at the intersection of the bottom 16 with the front 18 and left and right sides 22, 24, and forming a center channel 38 for air circulation along the bottom 16 running from the front 18 to the rear 20.

The angled venting slots 37 and angled surfaces 36 allow the panel to be placed directly above an adjacent panel, while preventing lower or underside vents from being closed off and preventing circulation through the panel. In the arrangement shown, convection currents route cool air through the panel; cool air flows into the panel through the slots 37, up into the interior 13 and out the open rear 20.

Although shown as angled venting slots 37, it is understood that the openings in the angled surfaces 36 can take a variety of forms. In one alternative embodiment, the angled surfaces include round or other shaped holes to provide airflow through the chassis 12. In either arrangement, the angled surfaces 36 and center channel 38 allow for cooling of the circuitry and other components internal to the chassis 12.

Within the chassis 12, a bus bar 40 is disposed along a top edge of the power panel toward the rear 20, and includes a plurality of holes 41 sized to receive bullet-nosed connectors of the circuit modules 28. Each of the plurality of holes 41 in the bus bar is aligned with a slot 26, such that each module can be electrically connected to the bus bar 40 when inserted into the panel 10.

Figure 2:
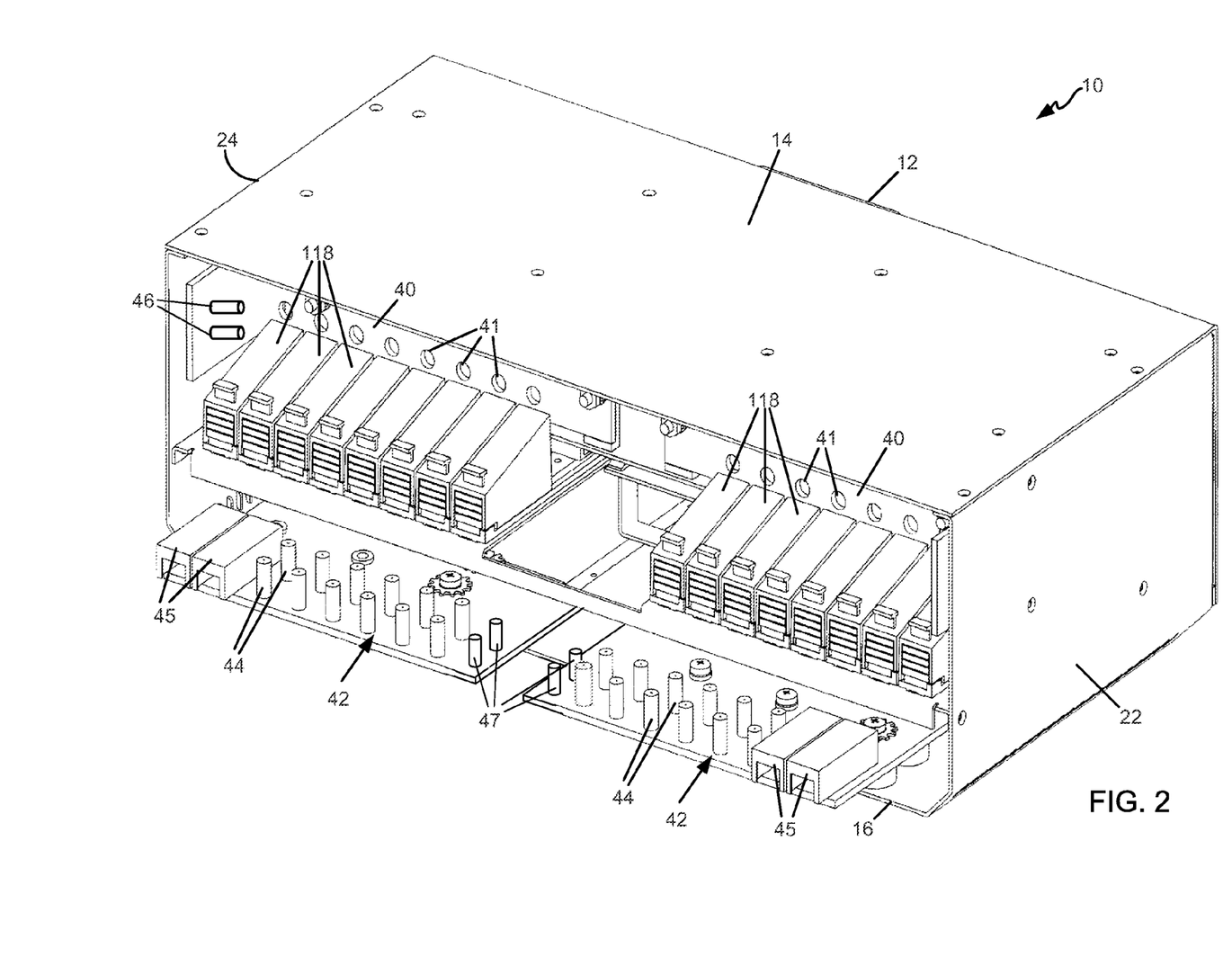
FIG. 2 is a rear perspective view of the power distribution panel of FIG. 1.

The bus bar 40, in the embodiment shown, provides an input power source to the circuit modules 28. In the embodiment shown (and particularly as illustrated in FIG. 2), the bus bar connects to terminals 46 which can be connected to a battery or other power source. As further seen below, the input power can be routed through to external equipment via the modules, and along a return path to the power source. In the embodiment shown, return connection terminals 47 can be included in the panel 10 to provide a location for connecting a return path to a battery or other power supply.

Connection of the input power terminals 46 to a power source delivers electrical power to the bus bar 40, which in turn provides power through the circuit modules 28. As described in further detail below, each of the circuit modules 28 includes corresponding output power terminals, and circuit protection elements disposed therebetween.

Also included in the chassis 12, a return power bus arrangement 42 includes a plurality of return power terminals 44. Return power terminals 44 are arranged in pairs, with two return power terminals for each associated slot used for a circuit module 28. The return power terminals 44 are electrically connected to the return connection terminals 47 for completing the circuit connecting the power source to the equipment powered via the panel 12. Each pair of return power terminals can be protected by a cover 45, such that when not being serviced, the input power terminals can be covered, preventing inadvertent connection or contact with the terminals.

Figure 5:
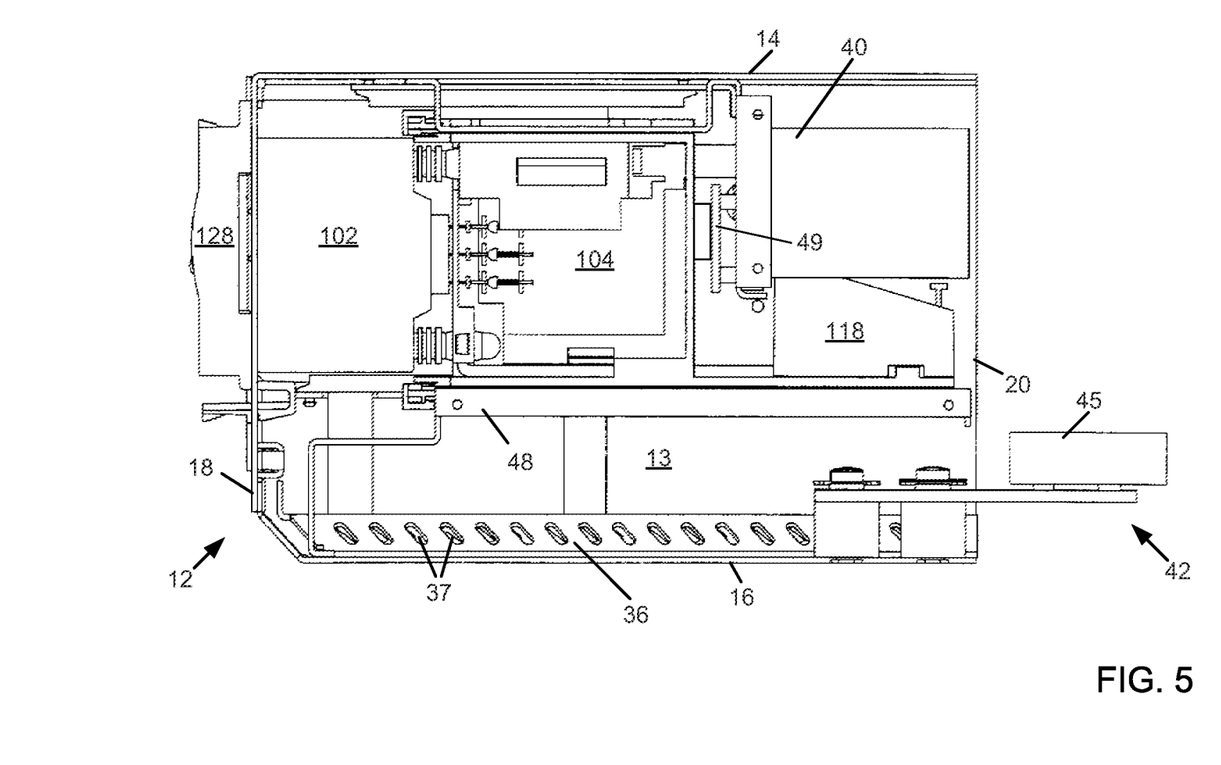
FIG. 5 is a side cutaway view of the power distribution panel of FIG. 1.
Figure 6:
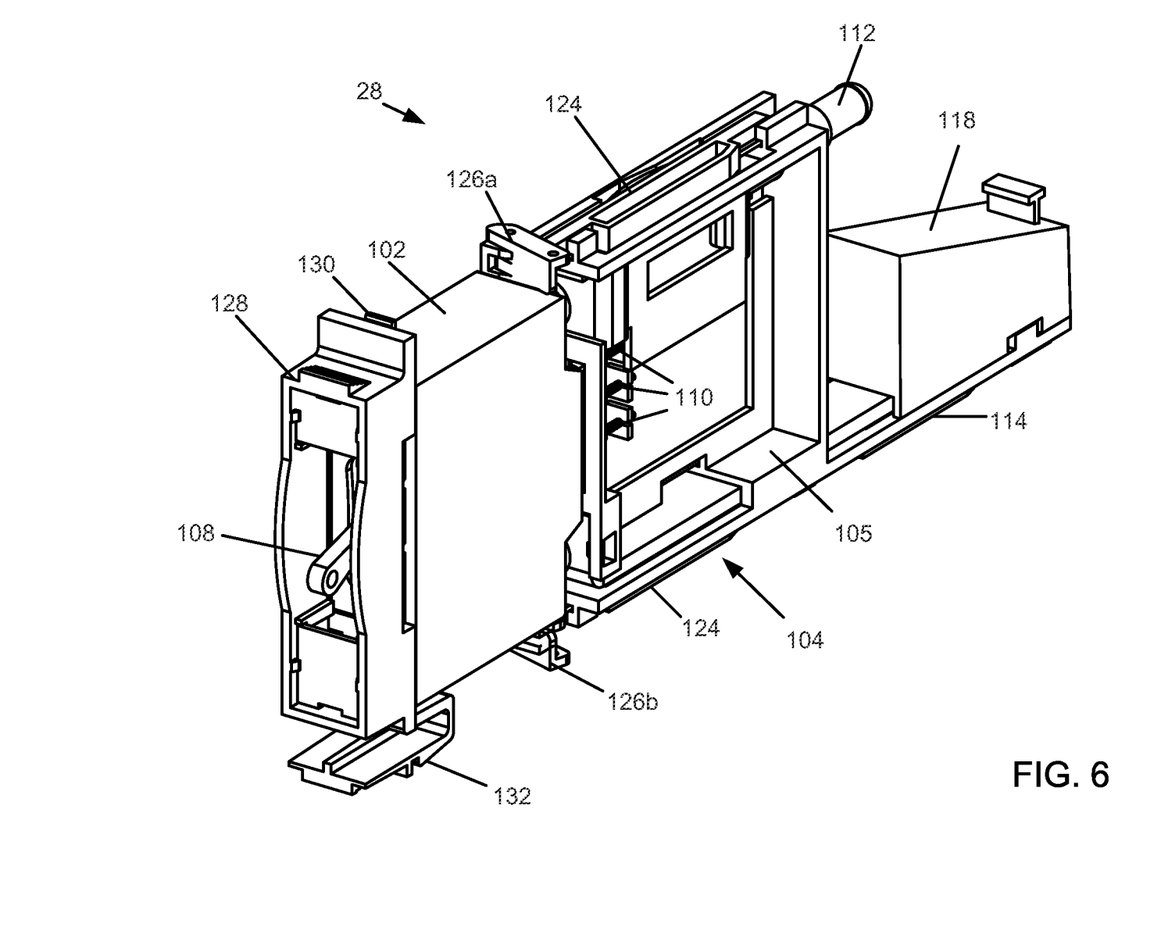
FIG. 6 is a perspective view of a circuit module useable with the power distribution panel of FIG. 1.
Figure 7:
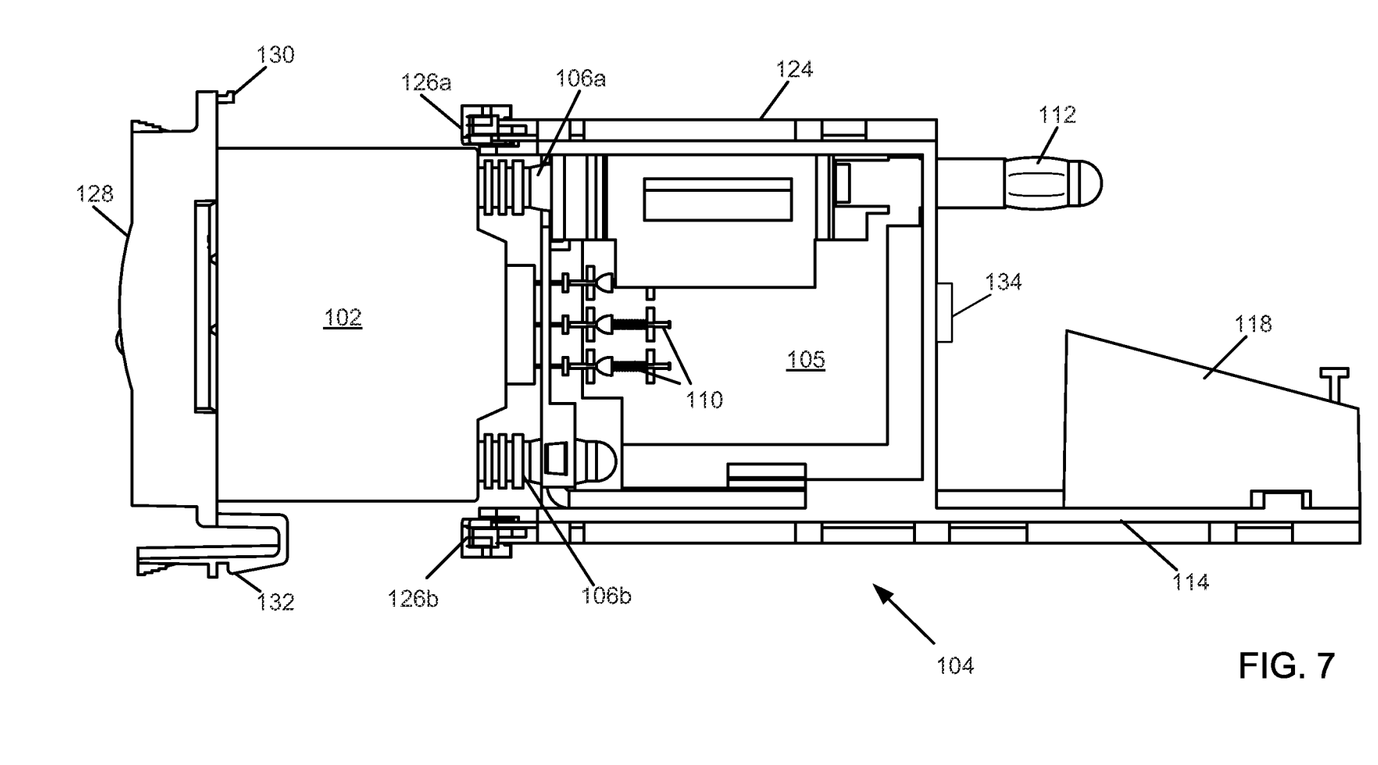
FIG. 7 is a side elevation view of the circuit module of FIG. 6.
Figure 8:
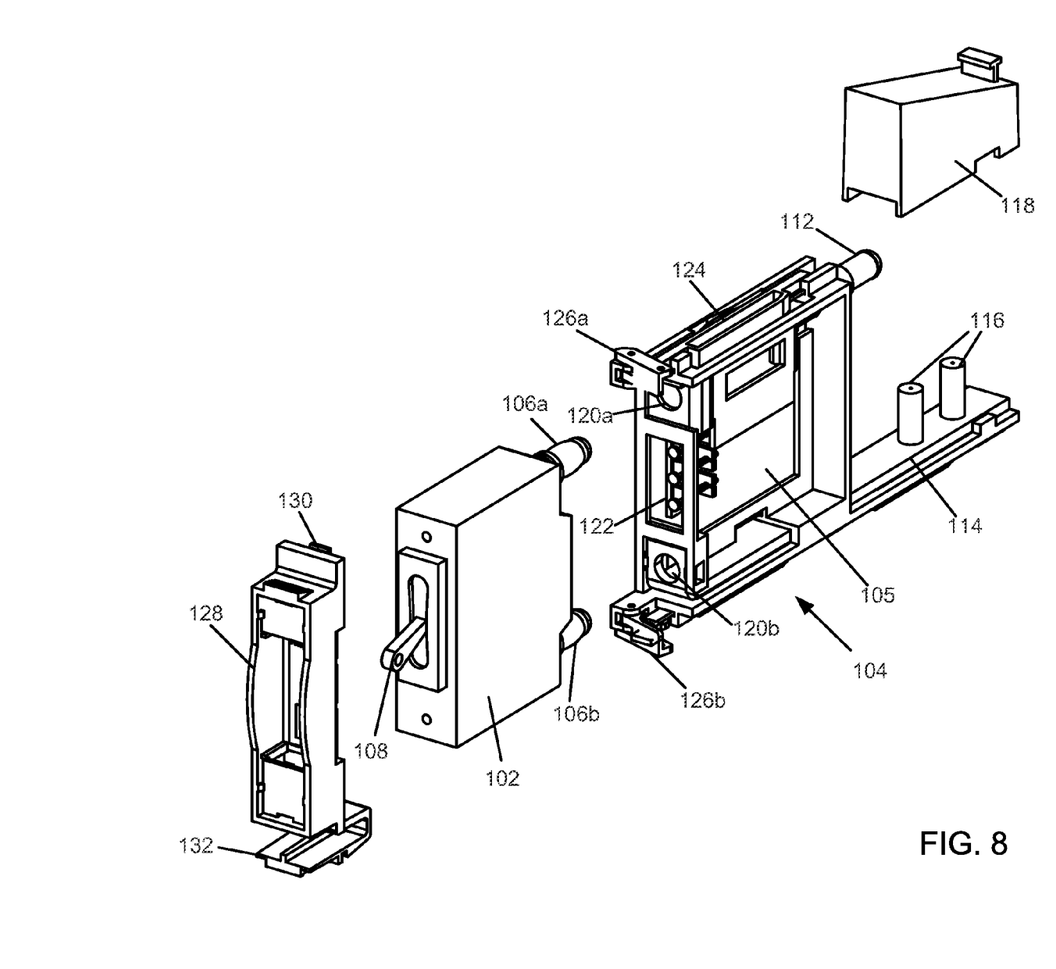
FIG. 8 is an exploded perspective view of the circuit module of FIG. 6.
Figure 9:
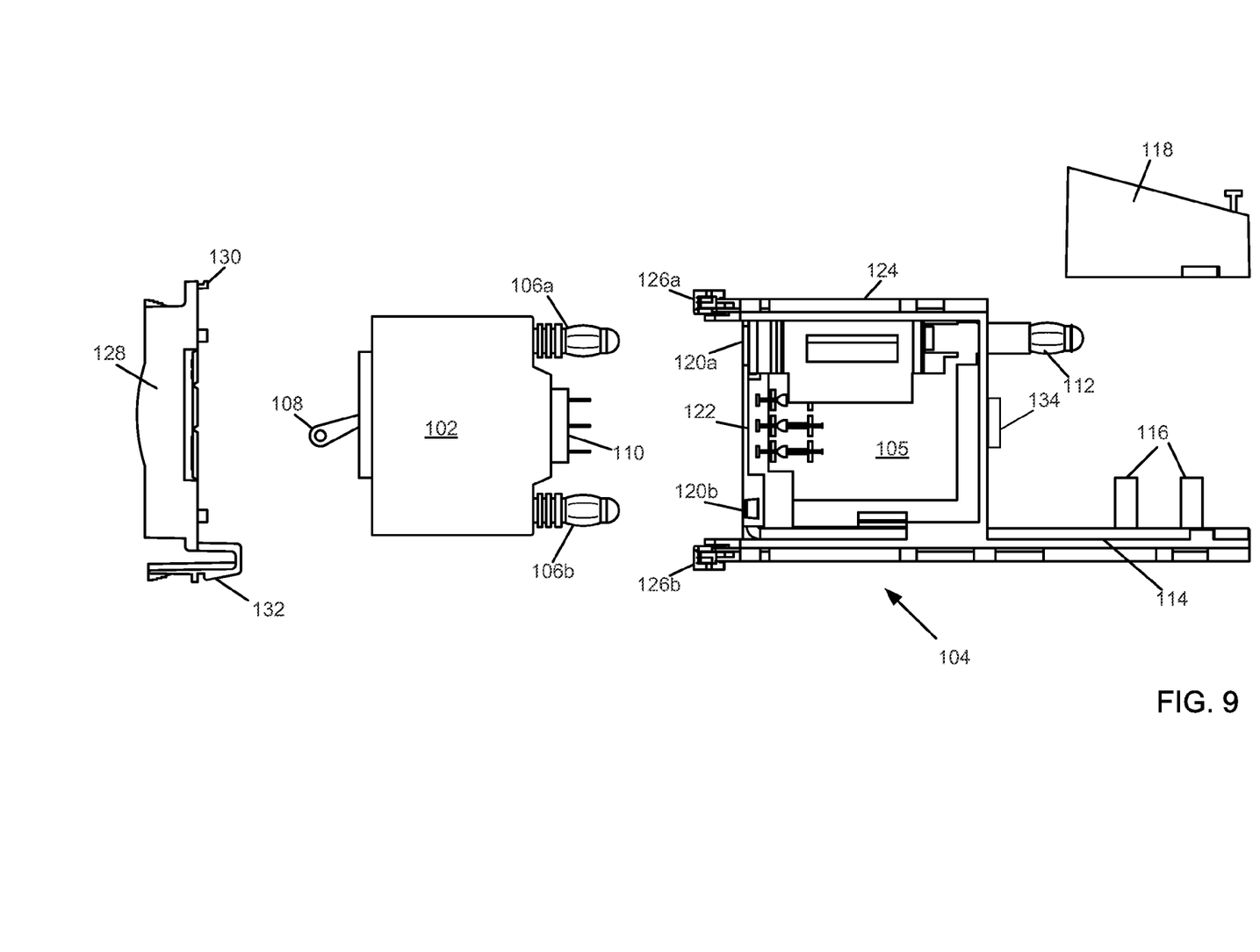
FIG. 9 is a side view of the circuit module of FIG. 6.

As seen most clearly in FIG. 5, each slot 26 is formed from an opening in the front 18 of the chassis 12, and further includes a guide 48 formed within the interior 13 and upon which the circuit module 28 rests when inserted into the chassis. Additional guides (not shown) can be formed in the interior 13 alongside the top 14 for guiding each module 28 into a slot. A backplane 49 extending across the panel toward the rear of the panel 10 provides a location into which circuit modules 28 can connect to provide electrical or communicative connection between a portion of the circuit module 28 and a control unit 34, as well as circuitry external to the panel 10. The backplane 49 can provide a plurality of sockets or other connection locations, with a separate connection location aligned with each slot 26 and located to receive a corresponding connector on a circuit module (illustrated below).

The control unit 34 includes communication and remote monitoring circuitry capable of communication with one or more of the circuit modules 28. The control unit 34 is capable of communicative connection to each of the slots 26 and therefore to each circuit module 28 inserted into a slot, for example by way of an electrical connection included within the slot and alongside a back of a circuit module, as illustrated in FIGS. 5 and 6-9, below.

In various embodiments, the control unit 34 can take any of a number of forms, and is upgradeable to provide differing functionality to the power panel 10. In certain embodiments, the control unit 34 can include alarming functionality, for example for generating a common or discrete alarm signal upon detection of a tripped/blown circuit protection element in one of the circuit modules 28, or aggregating alarm signals from modules present in the panel 10. Example alarming circuits useable in the control unit are described in U.S. Pat. Nos. 6,775,120, 7,120,002, 78,480, 127, and 7,768,760, the disclosures of which are hereby incorporated by reference in their entireties. In alternative embodiments, the control unit can include a programmable circuit configured to provide remote monitoring and communication with the panel, or can monitor current levels in each of the installed modules in the panel 10. In still other embodiments, the control unit can transmit one or more settings to the circuit modules 28, such as trip levels for the circuit protection devices included in those modules. An example of such functionality is described in U.S. Pat. No. 7,554,796, the disclosure of which is incorporated by reference herein in its entirety.

The control unit 34, and the panel 12 overall, can include additional features as well, for communication with and coordination of the various circuit modules 28 to be included therein.

Referring now to FIGS. 6-9, additional details of an example circuit module 28 are shown. The circuit module 28 generally is configured to receive input power from a bus bar at a bullet-nosed connector location, and route that power to an output terminal through one or more circuit protection elements and optional circuitry. The circuit module 28 generally provides a connector-based, unwired arrangement providing power distribution from the input power bus to a protected output terminal (discussed in further detail below), used to connect to the equipment. The circuit module 28 provides a combination of high amperage power connections as well as low voltage connections to the control unit 34, as further discussed below.

In the embodiment shown, the circuit module 28 includes a circuit protection element 102 interconnected with a body element 104. The circuit protection element 102 can be, in various embodiments, a fuse element or circuit breaker element, and can include a fuse or circuit breaker within a module including two bullet-nosed circuit connections 106a-b extending rearwardly. In the embodiment shown, the circuit protection element 102 includes a circuit breaker integrated therein, and having a breaker switch 108 exposed at a front side of the circuit protection element 102. In alternative embodiments, a front portion of the circuit protection element 102 can include a socket capable of receiving a fuse, rather than having such a circuit protection device constructed integral with the circuit protection element 102. In other embodiments, the circuit protection element can provide additional functionality, such as operating at one or more of a set of selectable trip levels. Other functionalities can be provided in the circuit protection element 102 as well.

In the embodiment shown, the circuit protection element 102 includes a plurality of signal pins 110 extending rearwardly between the two bullet-nosed connections. The signal pins 110 can provide a number of functions for the circuit protection element 102. In certain embodiments, the signal pins 110 provide alarming functionality for the circuit protection element 102 by activating upon detection of a blown fuse or tripped circuit breaker within the circuit protection element.

The body element 104 includes a main body 105 from which extends a rear facing bullet-nosed connector 112 located to connect to the bus bar 40 of the power panel 10. In the embodiment shown, this bullet-nosed connector 112 is located along a top side of the main body 105; however, other arrangements are possible as well. The body element 104 also includes an output power bus 114 extending rearwardly and including output terminals 116 for connection of electronic equipment. In the embodiment shown, the output power bus 114 includes a pair of output terminals on the output power bus; however, in other embodiments, other numbers of power terminals could be included.

A cover 118 can be fit over the output terminals 116 of each circuit module 28, such that when not in use the output terminals 116 of that circuit module 28 can be covered to prevent accidental connection to adjacent modules or leads. In the embodiment shown, the cover 118 is removable to allow connection of electrical equipment to the output terminals as needed.

The body element 104 includes a pair of forward facing bullet-nosed connector receptacles 120a-b extending into the main body 105 that are sized and located to receive the bullet-nosed circuit connections 106a-b of the circuit protection element. When the body element 104 and circuit protection element 102 are connected, the bullet-nosed connections 106a-b of the circuit protection element insert into the bullet-nosed connector receptacles 120a-b, thereby connecting the circuit breaker or fuse of the circuit protection element 102 between the input power connection (the bullet-nosed connector 112) and output terminals 116 of the body element 104. The body element 104 further includes a socket 122 on a front side, facing the circuit protection element 102. The socket 122 is configured to receive the signal pins 110 of the circuit protection element 102.

In certain embodiments, the body element 104 includes guides 124 formed on at least one of a top side and a bottom side of the main body 105 to assist in guiding the body element into a slot 26 of the classis 12. The body element 104 also includes release latches 126a-b positioned along the front of the main body 105, at the top and bottom. The release latches 126a-b are operatively attached to at least a portion of the guides 124, such that when the latches are depressed the guides change in size or position (e.g., width) due to movement of at least a portion of the guide, and therefore frictionally hold the body element 104 within a slot 26. Additionally, when toggling the release latches 126a-b to an open position, a rear edge of each latch will press against sheet metal within the chassis defining the slot, assisting in withdrawal of the body element 104 from the slot.

In certain embodiments, the body element 104 can include circuitry either in addition to or as a replacement for the circuit protection element 102. For example, the body element 104 can include circuitry within the main body 105 for interrupting a circuit formed between the input and output terminals based on a programmed trip level, as well as a processor for setting such trip levels. One example of such a configuration is described in U.S. Pat. No. 7,554,796, the disclosure of which was previously incorporated by reference. In another example, the body element 104 can include circuitry for monitoring current drawn through the module, or for monitoring one or more alarm conditions occurring in the module. In still further examples, the body element 104 can include circuitry for communicating with the control unit 34 or systems external to the panel 10. In the embodiment shown, a connector 134 mounted to a rear side of the body element 104 can electrically connect to a backplane (e.g., via a pin and socket or other type of connection) for forming a communicative connection to the control unit 34, as well as optionally to external systems. Other circuitry can be included as well.

In the embodiment shown, the circuit module 28 also includes a front cover 128 configured to fit over the circuit protection element 102 and at least partially house that element. The front cover 128 includes a tab 130 along a top edge of the circuit module 28, the tab 130 being configured to engage a top edge of a slot 26 on the front 18 of the chassis 12. The front cover 128 also includes a pressure latch 132 along a bottom edge of the circuit module 28 used to secure the circuit protection element 102 and body element 104 within the chassis 12. In the embodiment shown, the cover 128 and pressure latch 132 are made from a resilient plastic or metal, such that the pressure latch can be compressed to slide the circuit module 28 into or out from the socket 26. In certain embodiments, the cover 128 can correspond to a finger guard arrangement, an example of which is illustrated in U.S. Pat. No. 6,870,729, the disclosure of which is hereby incorporated by reference in its entirety. In such an arrangement, the cover can include a knock-out portion covering the opening for the slot 26, but capable of being removed when a circuit protection element 102 is present.

Referring to FIGS. 1-9 overall, it is recognized that additional features can be included in the power distribution module 10 or circuit modules 28 within the context of the present disclosure. For example, the circuit modules 28 of the present disclosure could include a circuit protection element lacking any such circuit protection element therein. In such an arrangement, the circuit protection element can include a snap-out center element in which a circuit breaker could be inserted. Furthermore, in certain embodiments, one or both of the circuit protection element 102 and the body element 104 are replaceable within the panel 10, and therefore allow for upgrades in functionality to the panel over time. For example, an initial configuration could include an arrangement including a fuse module, and upgrades could allow a user of the panel 10 to migrate to electronic or remotely-monitored arrangements including electronic protection devices (e.g. relays or other electronically-controlled circuit breakers).

It is recognized that the various embodiments of the present disclosure provide advantages over other power panel arrangements. For example, in certain embodiments discussed herein, each of the input and output terminals are associated with separate covers, rather than an optional single large cover associated with all of the terminals. This arrangement provides additional safety when the panel 10 is in use, because only those terminals that are being interconnected will be exposed, with the remainder of the terminals remaining covered to prevent accidental connection between adjacent terminals. Additionally, because each module includes separate circuitry for monitoring and circuit protection, the panel 10 allows a gradual upgrading of components to take place, on a module-by-module basis, and without requiring replacement of the panel overall.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A circuit module useable a power distribution system, the module comprising:
   a circuit protection element including first and second bullet-nosed connectors;
   a body element having first and second holes positioned on a front surface to receive the first and second bullet-nosed connectors, the body element including:
      a bullet-nosed input connector and an output terminal extending from a rear surface; and
      an electrical connector on the rear surface of the body element and positioned for connection to a backplane of a power panel.

2. The circuit module of claim 1, further comprising a front cover including one or more pressure latches.

3. The circuit module of claim 1, wherein the body element further includes a low voltage connector on the front surface positioned to receive alarm contacts of the circuit protection element.

4. The circuit module of claim 1, wherein the body element includes circuitry for selectively controlling a plurality of trip levels of the circuit protection element.

5. The circuit module of claim 1, wherein the circuit protection element is a circuit breaker.

6. The circuit module of claim 1, wherein the circuit protection element is a fuse.

7. The circuit module of claim 1, further comprising a terminal cover arranged to fit over the output terminal.

8. A body element of a circuit module comprising:
   a main body sized to be received into a slot of a power panel;
   a bullet-nosed input power connection extending rearwardly from the main body;
   an output power bus extending rearwardly from the main body, the output power bus including an output terminal;
   an electrical connector on a rear side of the main body and positioned for connection to a backplane of a power panel; and
   a pair of bullet-nosed connector receptacles in a front side of the main body, the pair of bullet nosed connector receptacles spaced apart to receive bullet-nosed connectors of a circuit protection module.

9. The body element of claim 8, further comprising a socket on the front side of the main body positioned to receive signal pins of a circuit protection module.

10. The body element of claim 8, further comprising:
    a guide positioned along an edge of the body element; and
    a release latch operatively connected to the guide, the release latch configured to move the guide to frictionally retain the body element within a slot of a power panel.

11. The body element of claim 8, further comprising a cover positioned over the output terminal.

12. A body element of a circuit module comprising:
    a main body sized to be received into a slot of a power panel;
    a socket on the front side of the main body positioned to receive signal pins of a circuit protection module;
    a guide positioned along an edge of the main body;
    a release latch operatively connected to the guide, the release latch configured to move the guide to frictionally retain the body element within a slot of a power panel;

a bullet-nosed input power connection extending rearwardly from the main body;
an output power bus extending rearwardly from the main body, the output power bus including an output terminal; and
a pair of bullet-nosed connector receptacles in a front side of the main body, the pair of bullet nosed connector receptacles spaced apart to receive bullet-nosed connectors of a circuit protection module.

\* \* \* \* \*